United States Patent [19]

Nakagawa

[11] Patent Number: 5,402,016

[45] Date of Patent: Mar. 28, 1995

[54] INTEGRATED HIGH-SPEED BIPOLAR LOGIC CIRCUIT

[75] Inventor: Shigeru Nakagawa, Hiji, Japan

[73] Assignee: Texas Instruments Incorporated, Dallas, Tex.

[21] Appl. No.: 66,518

[22] Filed: May 24, 1993

[30] Foreign Application Priority Data

May 22, 1992 [JP] Japan .................................. 4-156093

[51] Int. Cl.⁶ .......................................... H03K 19/091
[52] U.S. Cl. .................................. 326/101; 257/575; 326/100
[58] Field of Search ................ 307/443, 477, 457–459, 307/482.1; 257/575

[56] References Cited

U.S. PATENT DOCUMENTS

| | | | |
|---|---|---|---|
| 4,826,780 | 5/1989 | Takemoto et al. | 257/575 X |
| 4,999,518 | 3/1991 | Dhong et al. | 307/443 X |
| 5,239,212 | 8/1993 | Masuda et al. | 307/446 |

Primary Examiner—David R. Hudspeth
Attorney, Agent, or Firm—Dana L. Burton; Richard A. Stoltz; James C. Kesterson

[57] ABSTRACT

To provide a type of logic circuit, characterized by the fact that the novel-configuration logic circuit can be easily manufactured in a bipolar process, having a high integration degree and allowing a high-speed operation. For standard longitudinal-type NPN transistor TR0, its emitter E0 is connected to bias terminal BIAS, base B0 is connected to voltage source +Vcc, and collector C0 is connected to base B1 of PNP transistor TR1. For lateral-type PNP transistor TR1, emitter E1 is connected to voltage source Vxx, base B1 is connected to both the collector Co of NPN transistor TR0 and input terminal IN, and collectors C1, C2, C3, . . . Cn are connected to output terminals OUT1, OUT2, PUT3, . . .OUTn, respectively. Schottky diodes SBD1, SBD2, SBD3, . . .SBDn are connected between base B1 and collectors C1, C2, C3, . . . Cn of NPN transistor TR1 with a cathode on the side of the base and with an anode on the side of the collector.

5 Claims, 2 Drawing Sheets

INTEGRATED HIGH-SPEED BIPOLAR LOGIC CIRCUIT

This invention concerns a type of logic circuit. More specifically, this invention concerns a type of bipolar logic circuit made of bipolar transistors.

PRIOR ART

In the prior art, DTL (Diode Transistor Logic) and I²L (Integrated Injection Logic) are the typical bipolar logic circuits with low voltage and low power consumption.

FIG. 5 shows an example of DTL. It is made of NPN transistor Tr1, diodes D1, D2, and D3, bipolar resistors R1, R2, and R3, and NPN transistor Tr2. In this DTL basic circuit, when at least one of the input signals has voltage on level "L", NPN transistor Tr2 is OFF, and the "H" level output signal is obtained at its collector (output terminal). Only when all of the input signals are on the "H" level is NPN transistor Tr2 ON, and an "L" level output signal is obtained at the collector (output terminal). In this way, the DTL basic circuit acts as a NAND gate.

As shown in FIG. 6, I²L is basically made of a pair of transistors: PNP transistor Tr3 and multicollector-type NPN transistor Tr4. In this basic circuit of I²L, PNP transistor Tr3 acts as a current source and a load. From its collector C0, the drive current is fed to base B1 of NPN transistor Tr4. The base of NPN transistor Tr4 is also connected to input terminal (IN). When the input signal is on the "H" level, or when Input terminal IN is in the open state, NPN transistor Tr4 is set ON, and the "L" level output signal can be obtained from collectors C1, C2, and C3, respectively. When the input signal is on the "L" level, NPN transistor Tr4 is OFF, and the "H" level output signal is obtained from collectors C1, C2, and C3. In this way, the I²L basic circuit acts as an inverter.

FIG. 7 shows the basic configuration of I²L. An $N^-$-type epitaxial growth layer (104) is formed via an $N^+$ embedded layer (102) on a P-type semiconductor substrate (100). In said epitaxial growth layer (104), small P-type region (106) and large P type region (108) are separately formed by impurity diffusion. In large P-type region (108), multiple $N^+$ regions (110A), (110B), and (110C) are separately formed by impurity diffusion. In addition, $N^+$ type region (112) is formed in $N^-$-type epitaxial growth layer (104).

In this basic configuration of I²L, PNP transistor Tr3 is a lateral-type PNP transistor consisting of emitter E0 made of P-type region (106), base B0 made of $N^-$-type epitaxial growth layer (104) and $N^+$-type region (112), and collector C0 made of P-type region (108). On the other hand, NPN transistor Tr4 is a longitudinal NPN transistor consisting of emitter E1 made of $N^-$-type epitaxial growth layer (104) and $N^+$-type region (112), base B1 made of P-type region (108), and multicollectors C1, C2, C3 made of multiple $N^+$-type regions (110A), (110B), (110C).

However, in DTL, the number of elements is large, and a large area is needed for separating these elements from each other with insulation. Consequently, the integration degree cannot be increased.

At this point, for I²L, since it has a composite configuration of a PNP transistor and NPN transistor, there is a large common region and there is no need to separate them with insulation. Consequently, a high integration degree can be realized. However, for I²L longitudinal-type NPN transistor Tr4 operates in the reverse operational mode, and NPN transistor Tr4 may become easily saturated due to flow of surplus carriers into the base-collector joint of NPN transistor Tr4. Consequently, the frequency characteristics are degraded and a high-speed operation is difficult, which is a disadvantage. In addition, when I²L and other bipolar transistors are to be formed on a single substrate, a special diffusion process is needed for I²L to ensure the characteristics and performance of both. In addition, in the process used for a higher voltage rating, the thickness of the epitaxial growth layer is increased and the bulk resistance of this region is increased. However, in I²L, since the epitaxial growth layer forms the emitter region of the NPN transistor in the reverse operational mode, an increase in the bulk resistance of this region causes a further decrease in the frequency characteristics and current amplification rate. That is, the performance is further degraded, which is undesirable.

OBJECT OF THE INVENTION

An object of this invention is to solve the aforementioned problems of the conventional methods by providing a type of logic circuit, characterized by the fact that it can be manufactured in a simple bipolar process with a high integration degree and can perform high-speed operations.

SUMMARY OF THE INVENTION

In order to realize the aforementioned purpose, this invention provides a first logic circuit, characterized by the fact that it has a standard longitudinal type NPN transistor and a lateral-type PNP transistor that has its base biased by the aforementioned NPN-type transistor.

The second logic circuit of this invention is characterized by the fact that a Schottky clamp is connected between the base and emitter of the aforementioned PNP transistor to realize an even higher speed of operation of the aforementioned first logic circuit.

The third logic circuit of this invention is characterized by the fact that in order to provide the aforementioned first logic circuit as a semiconductor IC, it has a configuration consisting of a standard NPN transistor, consisting of a collector made of an N-type spitaxial layer formed on a semiconductor substrate or in the substrate, a base made of the first P-type region formed in the aforementioned N-type spitaxial layer, and an emitter made of an N-type region formed in the aforementioned first P-type region, as well as a lateral-type PNP transistor, which is made of an emitter made of the aforementioned first P-type region, a base made of the aforementioned N-type spitaxial layer, and one or several of collectors made of one or several second P-type regions formed discretely in the aforementioned N-type epitaxial layer.

The fourth logic circuit of this invention is characterized by the fact that in order to provide the aforementioned second logic circuit as a semiconductor IC, in the aforementioned third logic circuit, the impurity concentration of the aforementioned N-type epitaxial layer is coated by one or several metal layers formed discretely on the aforementioned layer [sic], with each of the aforementioned metal layers being electrically connected to the aforementioned second P-type region in a one-to-one relationship.

According to this invention, a standard longitudinal type NPN transistor acts as a load and current source.

Its collector current flows as the base current of the lateral-type PNP transistor. In this way, the PNP transistor is driven. When a positive voltage is applied on the emitter of the PNP transistor to cause the PNP transistor to operate, since the input signal applied on the base of the PNP transistor is at the "H" level, because a reverse voltage is applied between the emitter and base of the PNP transistor, the PNP transistor is OFF, and an "L" level output signal is obtained from the collector. When the input signal applied on the base of the PNP transistor is on the "L" level, a forward voltage is applied between the emitter and base of the PNP transistor, the PNP transistor is ON, and a "H" level output signal is obtained from the collector.

For the logic circuit of this invention, since the transistor for the input/output of signals acts as a lateral-type PNP transistor, a large current amplification rate can be obtained, the frequency characteristics are excellent, and a high operational speed can be realized. In addition, since a type of Schottky clamp, such as a Schottky diode, is connected between the base and collector of the PNP transistor, the collector voltage of the PNP transistor is clamped, saturation of the PNP transistor can be prevented, and an even higher operational speed can be realized.

When the logic circuit of this invention is formed as a semiconductor IC, the standard longitudinal-type NPN transistor and the lateral-type PNP transistor can be formed in a single tab by adopting a composite configuration with the N-type epitaxial growth layer and the first P-type region shared by them. Consequently, a high integration degree can be realized.

In addition, in the logic circuit of this invention, the impurity concentration of the N-type epitaxial layer is coated by one or several metal layers formed discretely on the layer so as to form the Schottky diode by ohmic contact. It is preferred that the metal wiring with respect to the second P-type region be extended to cover the N-type epitaxial layer so as to form the Schottky diode in a simple way. In this case, the cathode of the Schottky diode is connected via metal wiring to the two adjacent P-type regions, that is, the collector and the PNP transistor.

Figure 1:
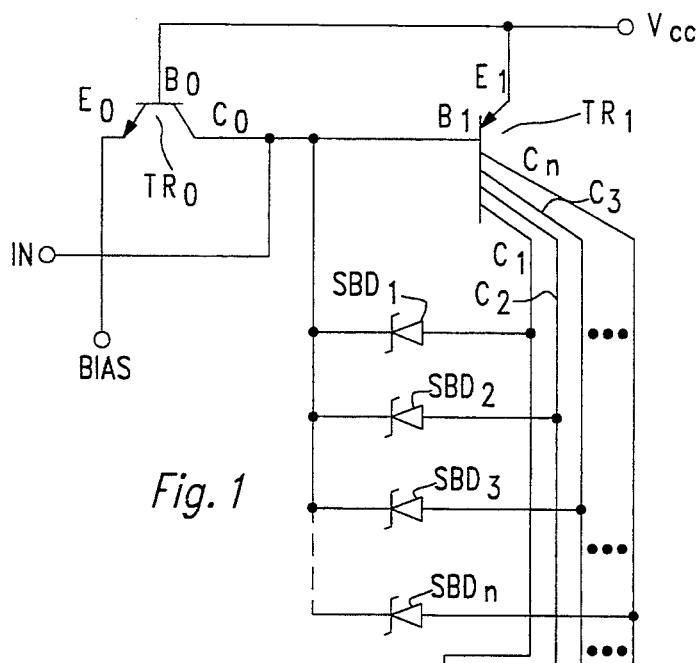
FIG. 1 is a circuit diagram illustrating the basic configuration of the logic circuit in an embodiment of this invention.

In reference numerals as shown in the drawings:
TR0, NPN transistor
TR1, PNP transistor
B1, base
E1, emitter
Ci, collector
SBDi, Schottky diode
10, semiconductor substrate
14, N⁻-type epitaxial growth layer
18, P-type region
20, P-type region
22, N⁻-type region
26, metal wiring
34, ohmic-contact portion

DESCRIPTION OF THE PREFERRED EMBODIMENTS

In the following, this invention will be explained in more detail with reference to embodiments illustrated by FIGS. 1–4.

FIG. 1 shows the basic configuration of the logic circuit in an embodiment in this invention. This logic circuit consists of one NPN transistor TR0, one multicollector PNP transistor TR1, and multiple Schottky diodes SBD1, SBD2, SBD3, ... SBDn.

Emitter E0 of NPN transistor TR0 is connected to bias terminal BIAS. Base B0 is connected to voltage source Vcc and collector C0 is connected to base B1 of PNP transistor TR1. For PNP transistor TR1, emitter E1 is connected to voltage source Vcc, base B1 is connected to both collector C0 of said NPN transistor TR0 and input terminal IN, and collectors C1, C2, C3, ... Cn are connected to output terminals OUT1, OUT2, OUT3, ... OUTn, respectively. Schottky diodes SBD1, SBD2, SBD3, ... SBDn are connected between base B1 and collectors C1, C2, C3, ... Cn of NPN transistor TR1, with the cathode on the side of base and with the anode on the side of the collector.

Bias terminal BIAS is connected to an appropriate constant-voltage power source or constant-current power source, and the bias is applied in a prescribed order between emitter E0 and base B0 of NPN transistor TR0. When the input signal is on the "H" level, the output of NPN transistor TR0 ( collector voltage ) becomes the "H" level, and a reverse bias is applied between emitter E1 and base B1 of PNP transistor TR1. Consequently, PNP transistor TR1 is OFF, and "L" level output signal is obtained from collectors C1, C2, C3, ... Cn. When the input signal is on the "L" level, the output of NPN transistor TR0 becomes the "L" level, and a forward bias is applied between emitter E1 and base B1 of PNP transistor TR1, PNP transistor TR1 is OFF, and the "H" level output signal is obtained from collectors C1, C2, C3, ... Cn.

In this way, this logic circuit basically acts as an inverter. In this logic circuit, since the voltage VCE between the collector and emitter of NPN transistor TR0 is lower than 0.1V at room temperature, the voltage VBE between the base and emitter of PNP transistor TR1 is about 0.7V at room temperature, and it is possible to operate the transistor at a voltage of about 0.8V. That is, a low-voltage low-power type of logic circuit can be realized.

In this logic circuit, Schottky diodes SBD1, SBD2, SBD3, ... SBDn are connected between base B1 and collectors C1, C2, C3, ... Cn of PNP transistor TR1, respectively, to set the Schottky clamps. For these Schottky diodes SBDi, the forward voltage is about 0.5V. Consequently, Collector C1 of PNP transistor TR1 is clamped at about 0.5V with respect to base B1. Consequently, in the state in which PNP transistor TR1 is ON, the voltage VBC between the base and collector is 0.5V. Consequently, the voltage between the emitter and collector becomes about 0.2V, and it is possible to prevent the injection of surplus carriers into the base-collector junction. Consequently, PNP transistor TR1 is not saturated and a high-speed operation can be carried out.

Figure 2:
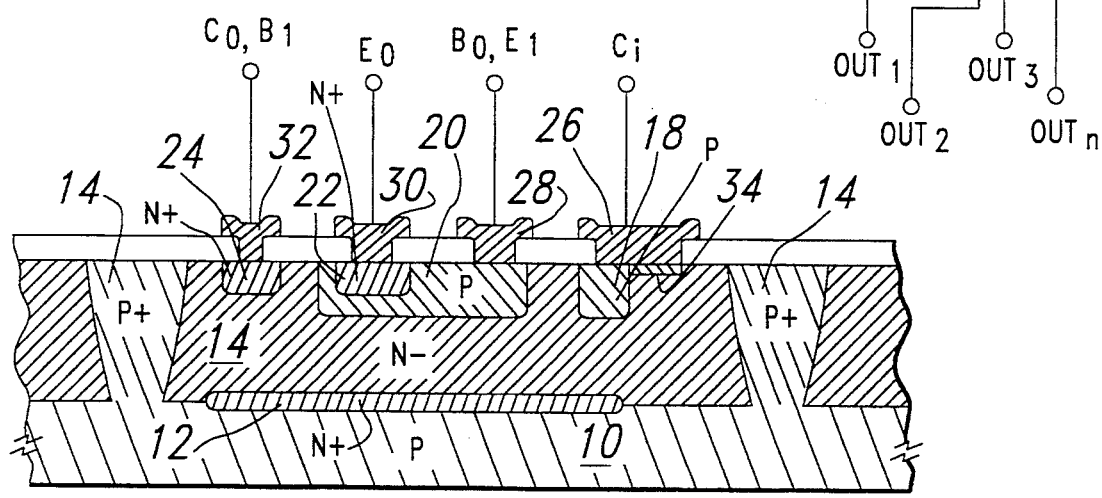
FIG. 2 is a cross-sectional view illustrating the configuration when the logic circuit in the embodiment is formed as a semiconductor IC.
Figures 3, 4:
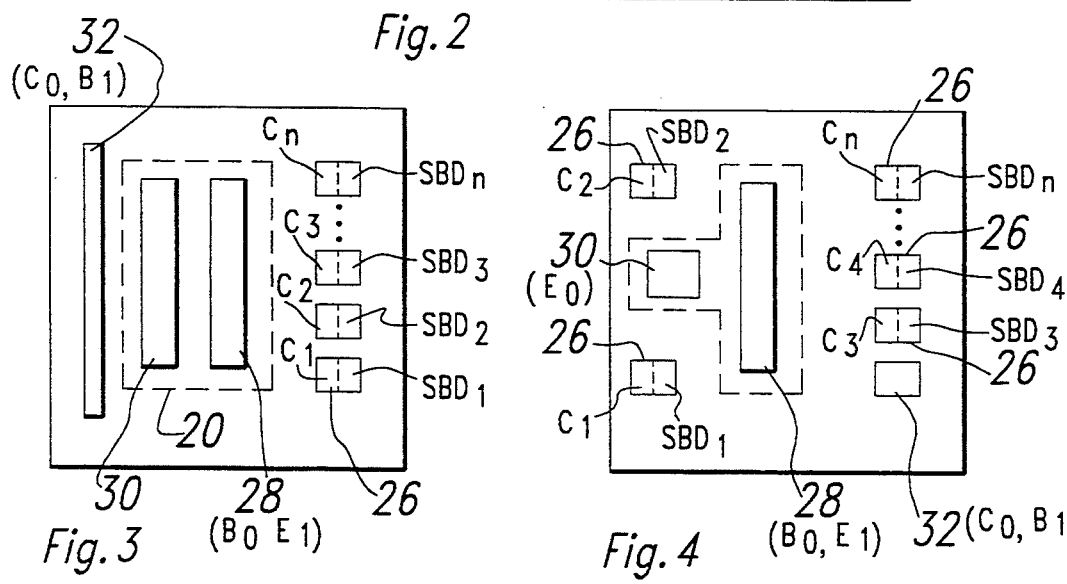
FIG. 3 is an upper view illustrating the layout of the configuration when the logic circuit in the embodiment is formed as a semiconductor IC.
FIG. 4 is an upper view illustrating a modified example of the layout of the semiconductor circuit in the embodiment.
Figure 5:
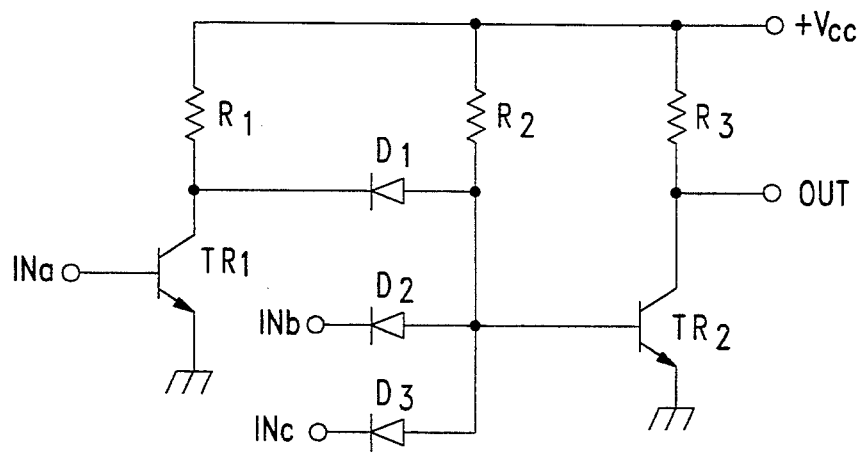
FIG. 5 is a circuit diagram illustrating the conventional circuit configuration of DTL.
Figure 6:
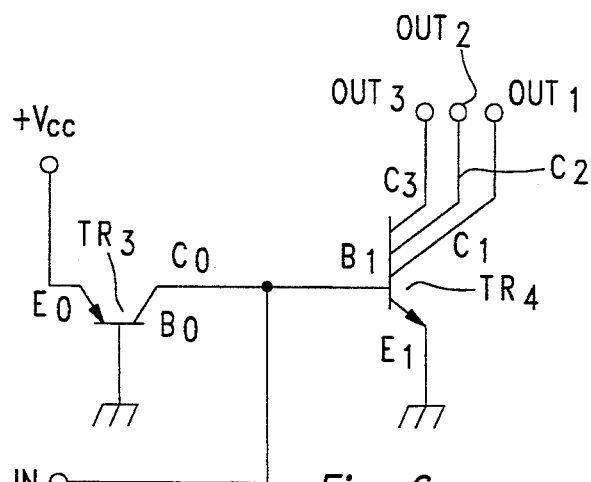
FIG. 6 is a circuit diagram illustrating the circuit configuration of I²L.
Figure 7:
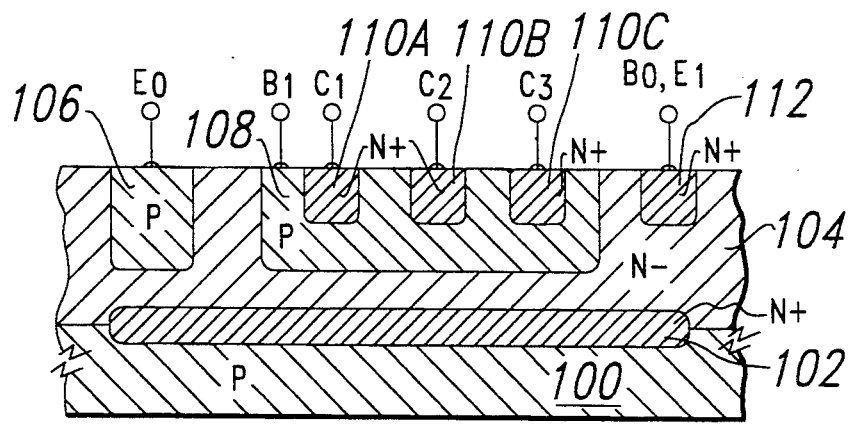
FIG. 7 is a cross-sectional view illustrating the basic configuration of I²L.

In the following, the configuration in which the logic circuit of this invention is used in the form of semiconductor IC will be explained with reference to FIGS. 2 and 3. FIGS. 2 and 3 are a cross-sectional view and upper side view of the semiconductor IC.

As shown in FIG. 2, an N⁻-type epitaxial growth layer (14) is formed on P-type semiconductor substrate (10) via an N+embedded layer (12). This epitaxial growth layer (14) is electrically isolated (separated) by means of a P+ isolating diffusion layer (16). This logic circuit is formed within this isolated epitaxial growth layer (14), that is, within the tab. First of all, in N⁻-epitaxial growth layer (14), multiple small P-type regions (18) and one large P-type region (20) are formed discretely by means of impurity diffusion. In FIG. 2, only one small P-type region (18) is shown. However, as a matter of fact, multiple P-type regions (18) are formed separated from each other in the direction perpendicular to the paper sheet. This pattern is illustrated in FIG. 3. In large P-type region (20), one N+-type region (22) is formed by means of impurity diffusion. Also, an N+-type region (24) is formed within N⁻-type epitaxial growth layer (14). On the surface of the substrate, a protective film made of silicon dioxide SiO₂ is formed. On P-type regions (18), (20) and N⁻-type regions (22), (24), aluminum wiring (26), (28), (30), (32) are formed, respectively, through contact holes by means of evaporation.

In this embodiment, the contact hole in the P-type region (18) extends in the transverse direction, aluminum wiring (26) makes contact with N⁻-type epitaxial growth layer (14), and Schottky diodes SBDi are formed by the ohmic contact portion (34).

In this semiconductor IC, NPN transistor TR0 is in the form of a standard longitudinal-type NPN transistor consisting of emitter E0 made of N+-type region (22), base B0 made of P-type region (20), and collector C0 made of N -type epitaxial growth layer (14). On the other hand, PNP transistor TR1 is in the form of a lateral-type PNP transistor consisting of emitter E1 made of P-type region (20), base B1 made of N⁻-type epitaxial growth layer (14), and multiple collectors C1, C2, C3, . . . Cn made of multiple P-type regions (18).

In this way, N⁻-type epitaxial growth layer (14) is used to form both collector C0 of NPN transistor TR0 and base B1 of PNP transistor TR1; P-type region (20) is used to form both the base B0 of NPN transistor TR0 and emitter E1 of PNP transistor TR1. That is, with N⁻-type epitaxial growth layer (14) and P-type region (20) being shared, NPN transistor TR0 and PNP transistor TR1 are formed within a single tab with a composite configuration. Consequently, this type of logic circuit can be formed with the same high integration degree as that of I²L.

In the logic circuit of this embodiment, transistor TR1 for the input/output of a signal acts as a lateral-type PNP transistor. Consequently, a high current amplification rate can be obtained, the frequency characteristics are excellent, and a high operational speed can be realized. For lateral-type PNP transistor TR1, the current flows in the lateral direction. Consequently, even when the thickness of N⁻-type epitaxial growth layer (14) is increased in the high-voltage rating process, there is still no decrease in the operational speed. Although the bulk resistance increases in longitudinal-type NPN transistor TR0 as N⁻-type epitaxial growth layer (14) becomes thicker, since this NPN transistor TR0 is a transistor that acts as a load and driver, it is not used for the input/output of signals. Consequently, there is virtually no degradation of the performance.

In the logic circuit of this invention, the multicollector-type transistor TR1 is in the form of a lateral-type PNP transistor. Consequently, when it is combined with other bipolar transistors on the same substrate, there is still no degradation of the performance due to their interference with each other. Consequently, the logic circuit in this embodiment differs from I²L in that there is no need to arrange a special diffusion process, and it can be formed using a conventional bipolar process.

FIG. 4 is an upper view of a modified example of the layout of the semiconductor IC in this embodiment. As can be seen from this example, the plane shapes and configuration positions of P-type regions (18), (20) and N+-type regions (22), (24) can be selected at will.

In the aforementioned embodiment, Schottky diodes SBDi are formed using aluminum wiring (26) for collector terminals Ci at positions adjacent to P-type regions (18). It is also possible to adopt the following scheme: aluminum or some other metal layer is coated on the surface of N⁻-type epitaxial growth layer (14) isolated from the P-type region so as to form Schottky diodes SBDi, followed by the connection of various metal layers to various collector terminals Ci.

In the aforementioned embodiment, epitaxial growth layer (14) is of the N⁻-type. However, it is also possible to use an N-type epitaxial growth layer. Also, it is possible to use silicon dioxide SiO₂ to replace P⁻ isolation diffusion layer (16).

In the aforementioned embodiment, the configuration has NPN transistor TR0 and one PNP transistor combined in one tab to form an inverter circuit. However, as the number of the transistors integrated in the tab is increased, it is also possible to form other types of logic circuits, such as the NAND gate, etc. Also, it is possible to form a conventional (single-collector) PNP transistor having only one collector instead of the multicollector form for PNP transistor TR1. In addition, when a high-speed operation is not needed, Schottky diodes SBDi may be omitted so as to cut the cost.

As explained in the above, in this invention, the circuit configuration has a standard longitudinal-type NPN transistor and a lateral-type PNP transistor, which has its base biased by the aforementioned NPN transistor combined. Consequently, the manufacturing process becomes easier, and it is possible to obtain logic circuits with a higher integration degree and higher operational speed. In addition, by connecting the Schottky clamp between the base and emitter of the PNP transistor, it is possible to prevent saturation of the PNP transistor, and the operational speed can be further increased.

I claim:
1. A logic circuit comprising:
   a vertical NPN transistor; and
   a lateral PNP transistor;
   wherein said vertical NPN transistor comprises:
      a substrate;
      an N-type collector over said substrate;
      a P-type base formed in a portion of said N-type collector; and an N-type emitter formed in a portion of said P-type base; wherein said PNP transistor comprises:
a P-type emitter wherein said P-type base is also said P-type emitter during normal operation;
an N-type base wherein said N-type collector is also said N-type base; and
one or more P-type normal operation collectors formed in a portion of said N-type base.

2. The circuit of claim 1, further comprising a clamp connected between said base and each of said P-type collectors of said PNP transistor.

3. The circuit of claim 2, wherein said clamp is formed by a Schottky diode.

4. The circuit of claim 3, wherein said NPN collector type is coated by one or more metal layers to form said Schottky diode by ohmic contact.

5. The circuit of claim 1, wherein said base of said PNP transistor is biased by said NPN transistor.

* * * * *